(12) United States Patent
Esmael (10) Patent No.: US 11,303,252 B2
(45) Date of Patent: Apr. 12, 2022

(54) BREAKDOWN PROTECTION CIRCUIT FOR POWER AMPLIFIER

(71) Applicant: Analog Devices International Unlimited Company, Limerick (IE)

(72) Inventor: Mohamed Moussa Ramadan Esmael, Cairo (EG)

(73) Assignee: Analog Devices International Unlimited Company, Limerick (IE)

( * ) Notice: Subject to any disclaimer, the term of this patent is extended or adjusted under 35 U.S.C. 154(b) by 115 days.

(21) Appl. No.: 16/582,772

(22) Filed: Sep. 25, 2019

(65) Prior Publication Data
US 2021/0091726 A1    Mar. 25, 2021

(51) Int. Cl.
  *H03F 1/52*    (2006.01)
  *H03F 3/21*    (2006.01)

(52) U.S. Cl.
  CPC ............ *H03F 1/526* (2013.01); *H03F 3/21* (2013.01)

(58) Field of Classification Search
  CPC ........ H03F 1/526; H03F 3/21; H03F 3/45071; H03F 1/22; H03F 1/52; H03F 3/189; H03F 1/30; H03K 17/0822
  USPC ...................................... 330/311, 207 P, 298
  See application file for complete search history.

(56) References Cited

U.S. PATENT DOCUMENTS

| | | |
|---|---|---|
| 4,382,195 A | 5/1983 | Pohl et al. |
| 6,720,831 B2 | 4/2004 | Dening et al. |
| 6,720,931 B1 | 4/2004 | Dening et al. |
| 6,990,323 B2 | 1/2006 | Prikhodko et al. |
| 8,648,656 B2 | 2/2014 | Nozaki et al. |
| 9,787,270 B2* | 10/2017 | Scott .................... H04B 1/0475 |
| 2006/0197594 A1 | 9/2006 | Scuderi et al. |
| 2011/0025422 A1 | 2/2011 | Thomas et al. |
| 2012/0139636 A1 | 6/2012 | Baker et al. |
| 2015/0145594 A1 | 5/2015 | Baker et al. |
| 2016/0197586 A1 | 7/2016 | Ripley |
| 2017/0359059 A1 | 12/2017 | Bazzani et al. |

FOREIGN PATENT DOCUMENTS

WO    WO 2010/135711    11/2010

OTHER PUBLICATIONS

Chen, Wei, et al., A Novel VSWR-Protected and Controllable CMOS Class E Power Amplifier for Bluetooth Applications, International Journal of Design, Analysis and Tools for Circuits and Systems, vol. 1, No. 1, Jun. 2011.

(Continued)

*Primary Examiner* — Hieu P Nguyen
(74) *Attorney, Agent, or Firm* — Knobbe, Martens, Olson & Bear, LLP (57) ABSTRACT

Systems, methods, and apparatuses for improving reliability and/or reducing the likelihood of breakdown of an amplifier or a component thereof. A system can include a sensing circuit electrically coupled to a transistor of the amplifier and configured to sense an AC voltage associated with the transistor. A protection circuit can be electrically coupled to the sensing circuit and the amplifier and can be configured to supply a DC voltage to the transistor of the amplifier based on the AC voltage sensed by the sensing circuit.

19 Claims, 5 Drawing Sheets

(56) References Cited

OTHER PUBLICATIONS

Gorisse, Jean, Regulation of power amplifiers under VSWR conditions in CMOS 65nm for 60GHz applications. Micro and nanotechnologies/Microelectronics. Université des Sciences et Technologie de Lille—Lille I, 2010. English. <tel-00563235>.

Ko, Jenwei, et al., A High-Efficiency Multiband Class-F Power Amplifier in 0.153μm Bulk CMOS for WCDMA/LTE Applications, 2017 IEEE International Solid-State Circuits Conference.

Zimmerman, Niklas, et al., An Over-Voltage Protection Circuit for CMOS Power Amplifiers, 2008 15th IEEE International Conference on Electronics, Circuits and Systems.

European Search Report for EP Application No. 20195755.2 dated Feb. 12, 2021 in 11 pages.

\* cited by examiner

BREAKDOWN PROTECTION CIRCUIT FOR POWER AMPLIFIER

RELATED APPLICATIONS

This application is related to U.S. application Ser. No. 16/055,437, filed Aug. 8, 2018, entitled "Breakdown Protection Circuit For Power Amplifier," which is hereby incorporated by reference in its entirety for all purposes.

FIELD

The present disclosure relates to improving power amplifier reliability and more particularly to techniques for reducing the likelihood of breakdown of a transistor of a power amplifier.

BACKGROUND

A rising demand lower cost of mobile communication devices has steered a trend towards the use of less expensive technology in power amplifier design, which has resulted in power amplifier reliability issues.

SUMMARY

The innovations described in the claims each have several aspects, no single one of which is solely responsible for the desirable attributes. Without limiting the scope of the claims, some prominent features of this disclosure will now be briefly described.

In some cases, a system can include an amplifier, a sensing circuit, and a protection circuit. The amplifier can include a first transistor and a second transistor. The sensing circuit can be electrically coupled to the first transistor of the amplifier and can be configured to sense an alternating current (AC) voltage at the first transistor of the amplifier. The protection circuit can be electrically coupled to the sensing circuit and the amplifier. The protection circuit can be configured to supply a first direct current (DC) voltage to a control terminal of the first transistor of the amplifier. The first DC voltage can vary based at least in part on the AC voltage sensed by the sensing circuit. The protection circuit can be configured to supply a second DC voltage to a control terminal of the second transistor of the amplifier. The second DC voltage can vary based at least in part on the AC voltage sensed by the sensing circuit.

The system of the preceding paragraph may also include any combination of the following features described in this paragraph, among other features described herein. The sensing circuit can be electrically coupled to the control terminal of the first transistor of the amplifier. The sensing circuit can be configured to sense the AC voltage at the control terminal of the first transistor of the amplifier. The sensing circuit can be electrically coupled to a power terminal of the first transistor of the amplifier. The sensing circuit can be configured to sense the AC voltage at the power terminal of the first transistor of the amplifier.

The system of any of the preceding two paragraphs may also include any combination of the following features described in this paragraph, among other features described herein. The first transistor and the second transistor can each include source, gate, and drain terminals. The control terminal of the first transistor can be the gate terminal of the first transistor. The control terminal of the second transistor can be the gate terminal of the second transistor. The source terminal of the first transistor can be electrically coupled to the drain terminal of the second transistor. At least one of the first transistor or the second transistor can be a field-effect transistor or a bipolar transistor. The first DC voltage can be different from the second DC voltage.

The system of any of the preceding three paragraphs may also include any combination of the following features described in this paragraph, among other features described herein. The protection circuit can include a first transistor in electrical communication with the sensing circuit. The first DC voltage can be based at least in part on a current flowing through the first transistor. The second transistor can be in electrical communication with the sensing circuit. The second DC voltage can correspond to or match a voltage at a power terminal of the second transistor.

In some cases, an apparatus for reducing a likelihood of breakdown of a transistor of an amplifier can include a protection circuit. The protection circuit can be electrically coupled to an amplifier. The protection circuit can be configured to supply a first DC voltage to a control terminal of a first transistor of the amplifier. The first DC voltage can vary based at least in part on an AC voltage at the first transistor. The protection circuit can be configured to supply a second DC voltage to a second transistor of the amplifier. The second DC voltage can vary based at least in part on the AC voltage at the first transistor.

The apparatus of the preceding paragraph may also include any combination of the following features described in this paragraph, among other features described herein. The AC voltage at the first transistor can correspond to or match an AC voltage at a control terminal of the first transistor. The AC voltage at the first transistor can correspond to or match to an AC voltage at a power terminal of the first transistor. The second DC voltage can be supplied to a control terminal of the second transistor of the amplifier. The second DC voltage can be supplied to a power terminal of the second transistor of the amplifier.

The apparatus of any of the preceding two paragraphs may also include any combination of the following features described in this paragraph, among other features described herein. The apparatus can include a sensing circuit electrically coupled to the protection circuit and a power terminal of the first transistor. The sensing circuit can be configured to sense the AC voltage at a power terminal of first transistor. The apparatus can include a sensing circuit electrically coupled to the protection circuit and the control terminal of the first transistor. The sensing circuit can be configured to sense the AC voltage at the control terminal of first transistor.

The apparatus of any of the preceding three paragraphs may also include any combination of the following features described in this paragraph, among other features described herein. At least one of the first transistor or the second transistor can be complementary metal-oxide-semiconductor (CMOS) transistors. At least one of the first transistor or the second transistor can include source, gate, and drain terminals. The control terminal of the first transistor can be the gate terminal of the first transistor. The source terminal of the first transistor can be electrically coupled to the drain terminal of the second transistor. The second DC voltage can be supplied to the source terminal of the second transistor of the amplifier. The second DC voltage can be supplied to the gate terminal of the second transistor of the amplifier.

In some cases, an apparatus for reducing a likelihood of breakdown of a transistor of an amplifier can include a sensing circuit and a protection circuit. The sensing circuit can be electrically coupled to an amplifier and can be configured to sense an AC voltage associated with voltage standing waves at the amplifier. The protection circuit can be configured to supply a DC voltage a control terminal of a transistor of the amplifier. The DC voltage can vary based at least in part on the AC voltage.

The apparatus of the preceding paragraph may also include any combination of the following features described in this paragraph, among other features described herein. To sense the AC voltage associated with the amplifier, the sensing circuit can be configured to sense the AC voltage at a control terminal of a transistor of the amplifier. To sense the AC voltage associated with the amplifier, the sensing circuit can be configured to sense the AC voltage at a power terminal of a transistor of the amplifier. The protection circuit can be configured to increase the DC voltage supplied to the control terminal of the transistor based at least in part on an increase in the AC voltage at the transistor. The protection circuit can be configured to increase the DC voltage supplied to the control terminal of the transistor based at least in part on a presence of voltage standing waves at the amplifier. The protection circuit can be configured to decrease the DC voltage supplied to the control terminal of the transistor based at least in part on a decrease in the AC voltage at the transistor.

In some cases, a system can include an amplifier and a protection circuit. The amplifier can include a transistor. The protection circuit can be electrically coupled to the amplifier. The protection circuit can include a controllable impedance, and a sensing circuit. The controllable impedance can be electrically coupled to a power terminal of the transistor. The sensing circuit can be electrically coupled to the transistor of the amplifier. The sensing circuit can be configured to sense an AC voltage at the transistor of the amplifier, and control the controllable impedance. Responsive to the sensed AC voltage satisfying an energy threshold, the sensing circuit can control the controllable impedance to dissipate at least some energy from the transistor. Responsive to the sensed AC voltage failing to satisfy the energy threshold, the sensing circuit can control the controllable impedance to operate as a high impedance load.

The system of the preceding paragraph may also include any combination of the following features described in this paragraph, among other features described herein. The controllable impedance can include at least one of a transistor, diode, capacitor, or resistor.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

These drawings and the associated description herein are provided to illustrate specific embodiments and are not intended to be limiting.

DETAILED DESCRIPTION

The terms "control terminal" and "power terminal" are used broadly herein to generally refer to various the terminals of field effect transistors (FETs) or bipolar junction transistors (BJTs). For example, the term "control terminal" can broadly refer to either the gate terminal of a FET or the base terminal of a BJT. Furthermore, the term "power terminal" can broadly refer to the drain terminal or the source terminal of a FET, or the emitter terminal or the collector terminal of a BJT. Thus, the terms "control terminal" and "power terminal" are to be broadly construed and should not be limited to a particular type of transistor.

With the increasing demand for lower cost of radio frequency (RF) devices, there is a growing trend towards the use of less expensive technology in power amplifier design, such the implementation of complementary metal-oxide-semiconductor (CMOS) technology in power amplifiers. However, although relatively inexpensive (for example, as compared to gallium nitride (GaN), gallium arsenide (GaAs), silicon-germanium (SiGe), or silicon bipolar power amplifiers), these power amplifiers tend to suffer from reliability issues, such as low breakdown voltages. This issue can be especially troublesome when load mismatches lead to high voltage standing wave ratios (VSWR) and therefore high peak voltages at the power amplifier output. For example, load mismatches at an antenna can lead to reflections of a transmitted signal and thereby to standing waves. High voltage standing waves can accelerate the long-term degradation of a power amplifier and/or can lead to breakdown of the amplifier or one of its components.

To address these and other problems, techniques for improving reliability and/or reducing a likelihood of breakdown of an amplifier (specifically, breakdown of one or more transistors of the amplifier) are disclosed. A protection circuit can adaptively bias transistors of the amplifier based on energy sensed at the amplifier. For example, using the adaptive bias schemes described herein, the protection circuit can advantageously reduce the likelihood of breakdown of the amplifier caused by excessive energy received at the input/output of the amplifier. In some cases, to reduce the likelihood of breakdown of the amplifier, the protection circuit can supply, to the control terminal of the transistor, a variable DC bias voltage that varies based on the AC voltage sensed at the control terminal or the power terminal of the transistor. In this way, the protection circuit can dynamically modify the voltage difference between the power terminal and the control terminal of the transistor, thereby preventing the voltage difference between the terminals from satisfying an energy threshold and preventing the transistor from operating in a breakdown operating region. Accordingly, in some cases, the protection circuit disclosed herein can advantageously protect an amplifier from breakdown due to voltages exceeding an energy threshold, VSWR load variation, or the like.

Figure 1A:
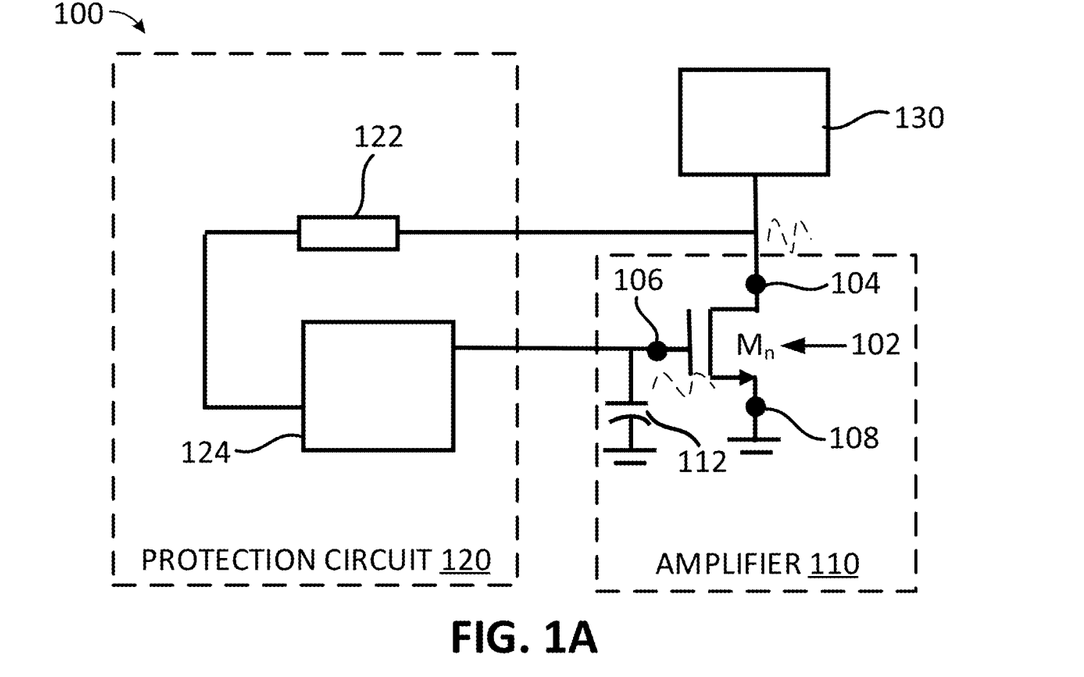
FIGS. 1A and 1B illustrate block diagrams of example systems for reducing the likelihood of breakdown of a transistor of an amplifier.
Figure 1B:
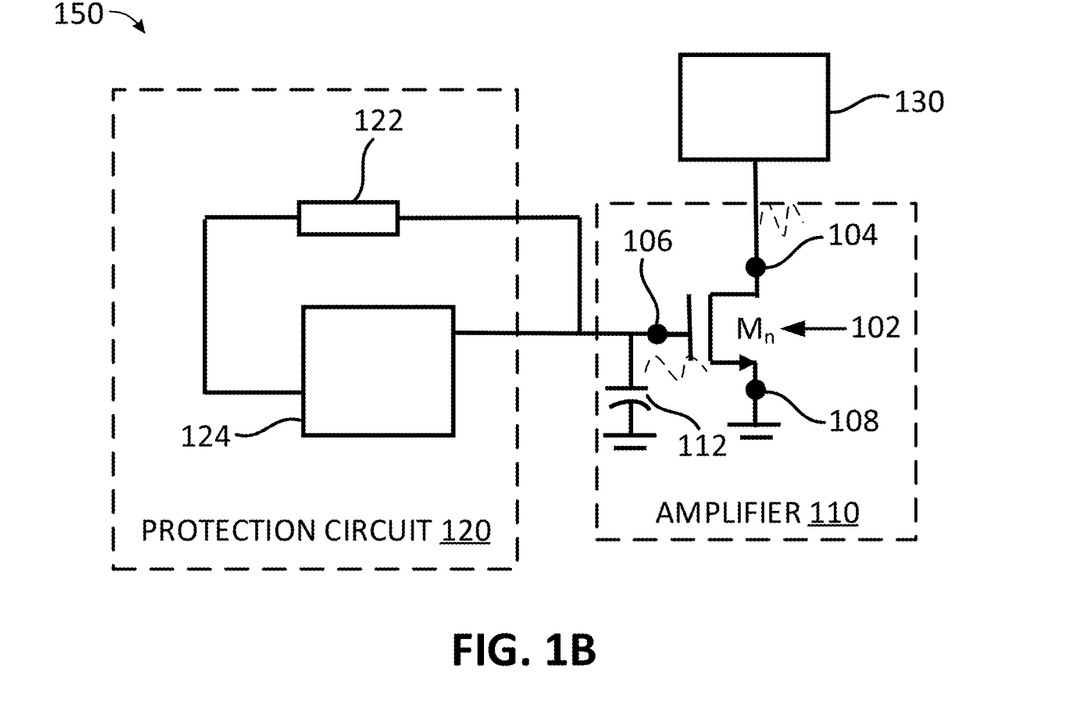

FIGS. 1A and 1B illustrate block diagrams of example systems 100, 150 for reducing the likelihood of breakdown of a transistor 102 of an amplifier 110. In the illustrated examples of FIGS. 1A and 1B, the systems 100 and 150 include an amplifier 110, a protection circuit 120, and a load circuit 130. FIG. 1A illustrates the sensing circuit 122 of the protection circuit 120 coupled to the power terminal 104 of the amplifier 110, while FIG. 1B illustrates the sensing circuit 122 of the protection circuit 120 coupled to the control terminal 106 of the amplifier 110. It will be appreciated that the systems 100 or 150 can include fewer or more components as desired. For example, in some implementations, the systems 100 or 150 may not include the amplifier 110 and/or the load circuit 130. Furthermore, it will be appreciated that the sensing circuit 122 of the protection circuit 120 can be electrically coupled to any of the terminals of the transistor 102.

The amplifier 110 can increase the voltage, current, or power of a signal. In some cases, the amplifier 110 can amplify a signal prior to transmission of the signal. For example, the amplifier 110 can be configured to drive an antenna of the load circuit 130. In some cases, the amplifier 110 can amplify a signal after the signal has been received. For example, the amplifier 110 can be configured to increase a power of a signal received at an antenna of the load circuit 130. In some cases, the amplifier 110 is a radio frequency (RF) power amplifier (PA) that converts a lower power RF signal into a higher power RF signal. In some cases, the amplifier 110 can be an operational amplifier or can have a differential input.

The amplifier 110 can include one or more transistors 102. Although the transistor 102 is illustrated as an NMOS transistor, it will be understood that the transistor 102 can be any type of transistor. For example, in some implementations, the transistor 102 is a FET, such as a metal oxide semiconductor FET (MOSFET), complementary metal-oxide-semiconductor (CMOS) transistor, an n-type metal oxide semiconductor (NMOS) transistor, or a p-type metal oxide semiconductor (PMOS) transistor. As another example, in some implementations, the transistor 102 is a bipolar transistor, such as a BJT or a heterojunction bipolar transistor (HBT). Furthermore, the amplifier 110 can include one or more capacitive, resistive, inductive, or other elements. For example, as illustrated in FIGS. 1A and 1B, the amplifier 110 can include a capacitor, such as capacitor 112 which is illustrated as being electrically coupled between the control terminal 106 of the transistor 102 and ground.

The load circuit 130 can include an antenna 128. In some cases, the antenna 128 can correspond to an antenna of a transmitter, antenna of a receiver, and/or an antenna of a transceiver. In some implementations, the load circuit 130 can provide an interface between the amplifier 110 and the antenna 128. In some cases, the load circuit 130 may not include an antenna 128.

In some cases, the load circuit 130 can include an impedance matching circuit. For example, similar to the load circuit 130 of FIG. 3, the load circuit 130 an output/input matching circuit 340. For example, the output/input matching circuit 340 can be configured to adjust impedance to produce an optimum or desired power.

The protection circuit 120 can reduce the likelihood of breakdown of the amplifier 110. In some cases, breakdown of amplifier 110 corresponds to failure of or damage to the amplifier 110 or components thereof. For example, in some cases, the transistor 102 may be susceptible to damage when exposed to energy (e.g., brief exposure or prolonged exposure) that satisfies an energy threshold. In some cases, the protection circuit 120 can reduce the likelihood of breakdown of the amplifier 110 by reducing the likelihood that the amplifier 110 is exposed to or receives energy that exceeds the energy threshold. For example, the protection circuit 120 can prevent the amplifier 110 from being exposed to energy that exceeds the energy threshold or can reduce an amount of time over which the amplifier 110 is exposed to energy that exceeds the energy threshold.

The energy threshold can vary across embodiments. For example, the energy threshold can correspond to a particular current, voltage, or operating region of the transistor 102. In some cases, the transistor 102 may be susceptible to damage when a voltage difference between two or more terminals of the transistor 102 satisfies a breakdown voltage threshold. For instance, damage may occur to one or more diodes, resistive channels, or other elements of the transistor 102 when a voltage difference between terminals satisfies the breakdown voltage threshold, which can cause the transistor 102 to breakdown or function undesirably (for example by allowing an undesired current to flow through the transistor 102). In some such cases, the energy threshold can correspond to the breakdown voltage threshold, and the protection circuit 120 can be configured to reduce the likelihood of the amplifier's 110 exposure to voltages that satisfy the breakdown voltage threshold. As another example, in some cases, the protection circuit 120 can be configured to supply a variable bias voltage to the amplifier's 110 to compensate for the amplifier's 110 exposure to voltages that satisfy the breakdown voltage threshold.

As another example, in some cases, the energy threshold can correspond to a current threshold. For instance, the transistor 102 may be susceptible to damage if exposed to a current that satisfies a breakdown current threshold. In some such cases, the energy threshold can correspond to the breakdown current threshold, and the protection circuit 120 can be configured to prevent or limit the amplifier's 110 exposure to currents that satisfy the breakdown current threshold.

Furthermore, in some cases, the energy threshold can correspond to an operating region of the transistor 102. For example, in some cases, the energy threshold can correspond to the breakdown operating region of the transistor 102, and the protection circuit 120 can reduce the likelihood of the transistor 102 being exposed to the energy threshold that would likely cause the transistor 102 to operate in the breakdown operating region.

The protection circuit 120 can include one or more sensing circuits 122, which can sense or be configured to sense (for example, monitor, detect, receive) energy associated with the amplifier 110. For example, in the illustrated example of FIG. 1A, the sensing circuit 122 is electrically coupled to the first power terminal 104 of the transistor 102 and can sense energy corresponding to the first control terminal 104 of the transistor 102. As another example, in the illustrated example of FIG. 1B, the sensing circuit 122 is electrically coupled to the control terminal 106 of the transistor 102 and can sense energy corresponding to the control terminal 106 of the transistor 102. It will be understood that the sensing circuit 122 can be electrically coupled to and/or can sense energy corresponding to any of the terminals 104, 106, or 108 of the transistor 102. Furthermore, in some cases, the sensing circuit 122 can be electrically coupled and/or sense energy corresponding to one or more terminals of another transistor of the amplifier 110, such as transistor 202 of any of FIGS. 2-4.

In some cases, the energy sensed by the sensing circuit 122 includes alternating current (AC) energy, such as an AC current or an AC voltage. In some cases, the energy sensed by the sensing circuit 122 includes direct current (DC) energy, such as a DC current or a DC voltage.

The sensing circuit 122 can include one or more resistive, capacitive, inductive, impedance, active, or passive elements. For example, the sensing circuit 122 can include one or more capacitors, resistors, inductors, diodes, transistors (for example, a FET or a BJT) transmission lines, couplers, or amplifiers (for example, an operational amplifier), or the like. In some cases, the sensing circuit 122 can be electrically coupled to a supply circuit 124, as described below. Furthermore, it will be understood that the sensing circuit 122 can be part of the protection circuit 120 and/or the supply circuit 124. Alternatively, in some cases, the sensing circuit 122 can be separate from the protection circuit 120 and/or the supply circuit 124.

Figure 2:
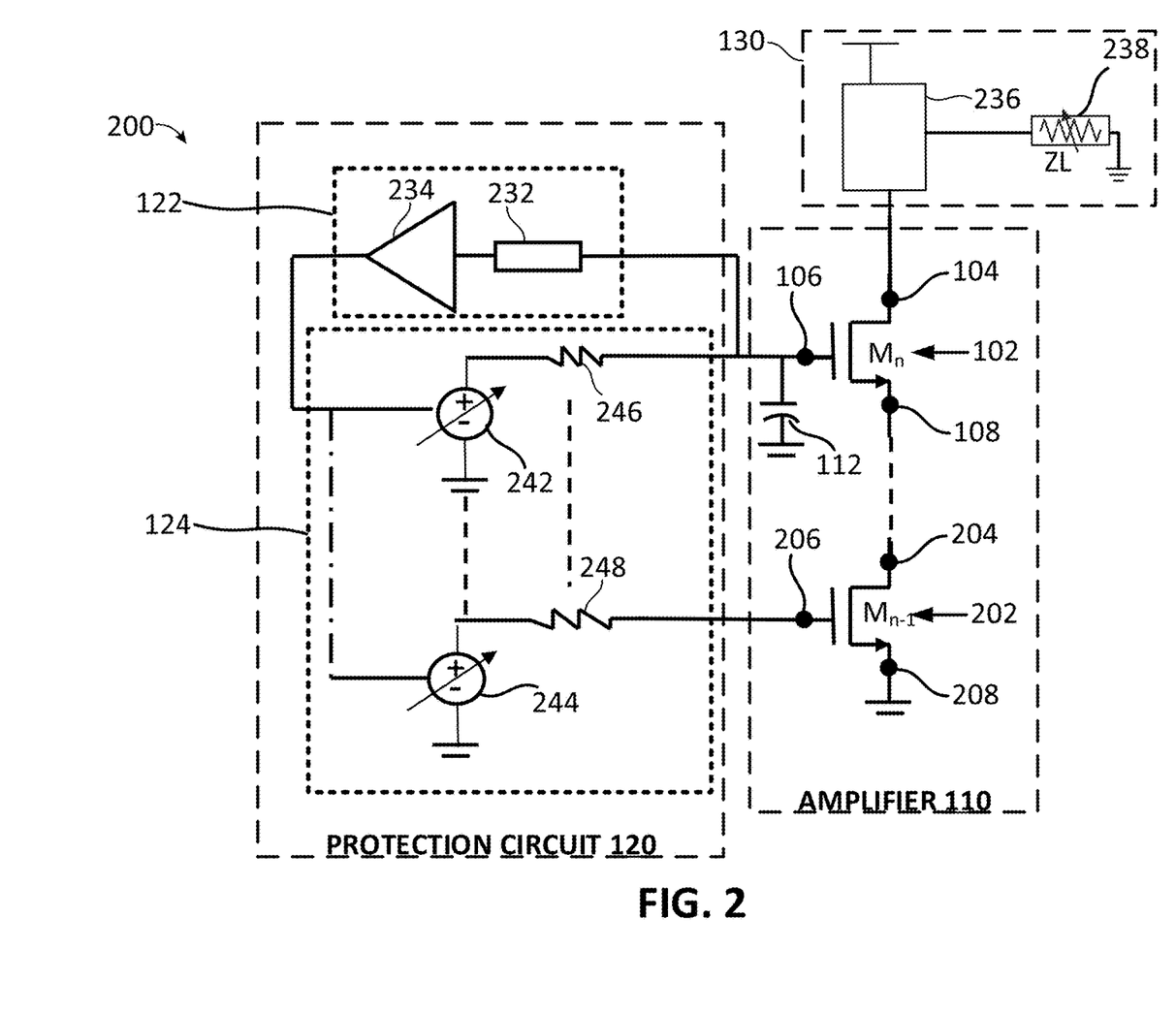
FIG. 2 illustrates a block diagram of an example system for reducing the likelihood of breakdown of a transistor of an amplifier.
Figure 3:
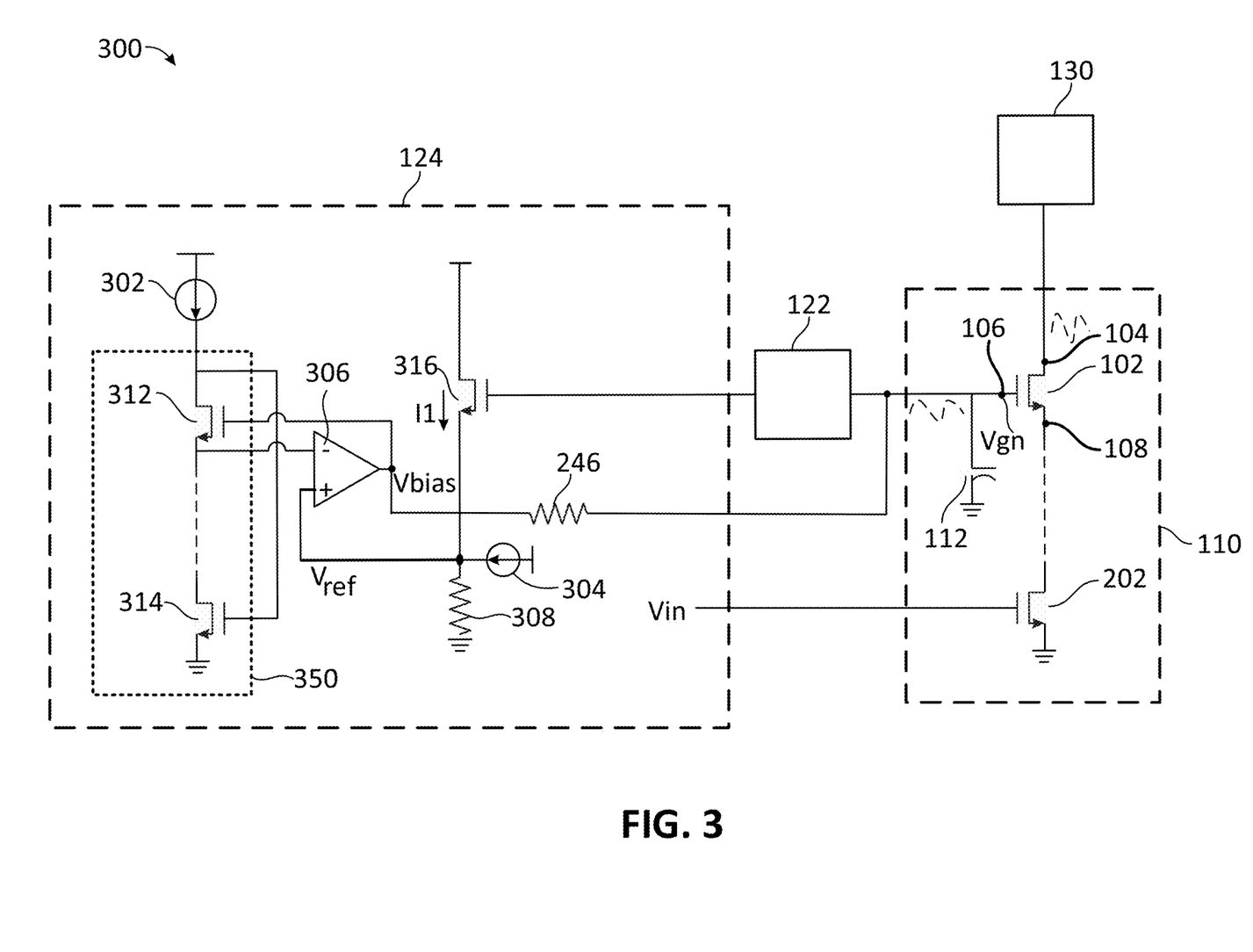
FIG. 3 illustrates a block diagram of an example system for reducing the likelihood of breakdown of a transistor of an amplifier.
Figure 4:
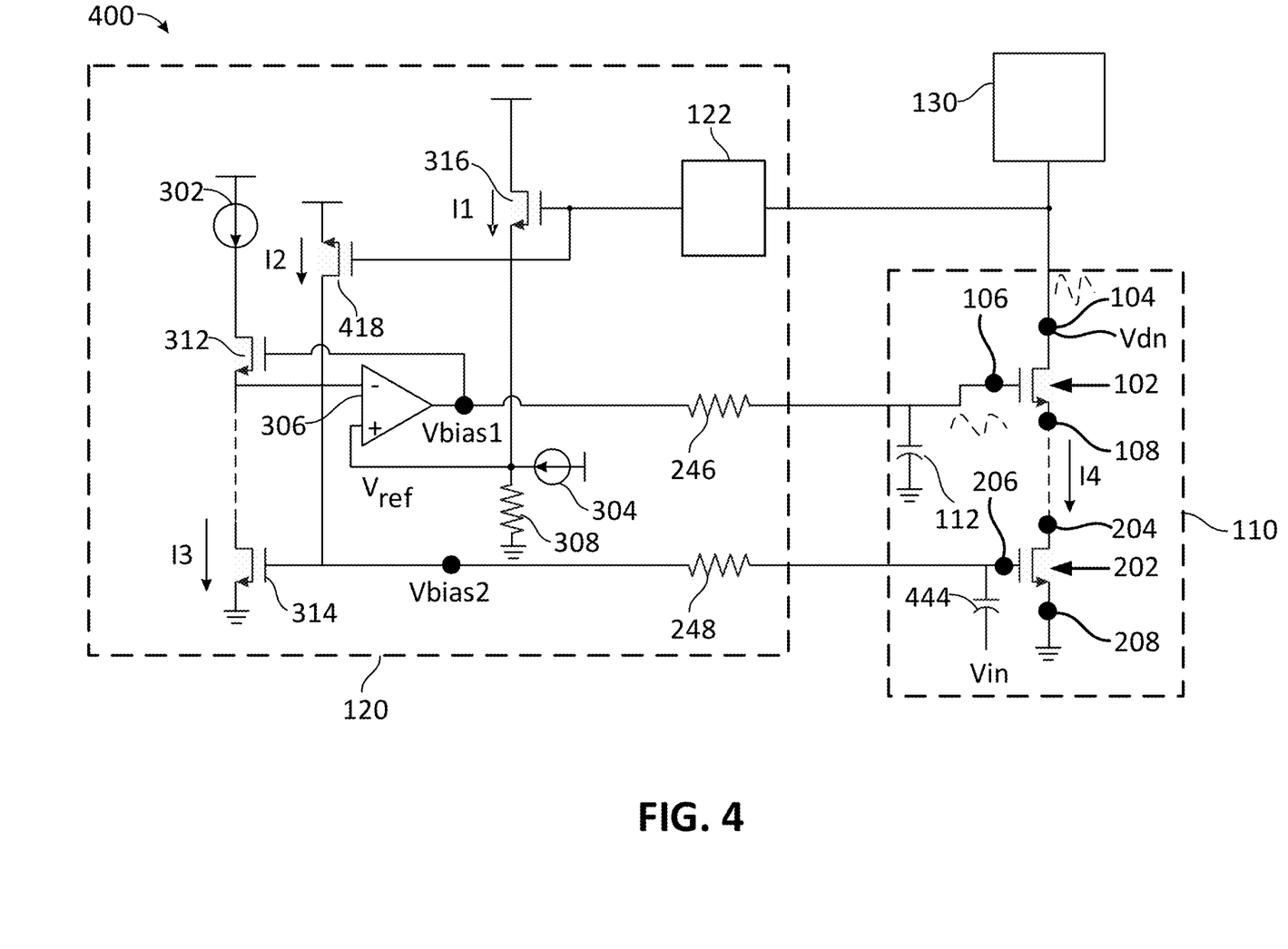
FIG. 4 illustrates a block diagram of an example system for reducing the likelihood of breakdown of the transistors of an amplifier.

The protection circuit 120 can include a supply circuit 124. The supply circuit 124 can be configured to supply energy to the transistor 102. For example, as illustrated in FIGS. 1A and 1B, the supply circuit 124 can be electrically coupled and configured to supply energy to the control terminal 106 of the transistor 102. However, it will be understood that, in some cases, the supply circuit 124 can be electrically coupled to one or more of the power terminals 104 or 108. Furthermore, in some cases, the supply circuit 124 can supply energy to more than one transistor, such as illustrated in FIGS. 2-4.

In some cases, the energy supplied by the supply circuit 124 includes alternating AC energy, such as an AC current or an AC voltage. In some cases, the energy supplied by the supply circuit 124 includes DC energy, such as a DC current or a DC voltage. In some cases, the amount of energy supplied by the supply circuit 124 can be based at least in part on energy sensed by the sensing circuit 122. For example, in some cases, the energy supplied by the supply circuit 124 varies based on the energy sensed by the sensing circuit 122. For instance, in some cases, the energy supplied by the supply circuit 124 increases as the energy sensed by the sensing circuit 122 increases. As a corollary, in some cases, the energy supplied by the supply circuit 124 decreases as the energy sensed by the sensing circuit 122 decreases.

As a first non-limiting example, and with respect to FIG. 1A, the sensing circuit 122 senses an AC voltage at the first power terminal 104 of the transistor 102 of the amplifier 110, and outputs a voltage output corresponding to the sensed AC voltage. The supply circuit 124 converts the voltage output of the sensing circuit 122 into a DC bias voltage, which it provides to the control terminal 106 of the amplifier 110. For example, the supply circuit 124 can convert the voltage output into a current using a transistor and can generate the DC bias voltage based on the current. Further, the supply circuit 124 can supply the DC bias voltage to the control terminal 106 of the transistor 102 of the amplifier 110. The DC bias voltage can vary based on the sensed AC voltage. For example, in some cases, the DC bias voltage increases as the sensed AC voltage increases. As a corollary, in some cases, the DC bias voltage decreases as the sensed AC voltage decreases. As another example, in some cases, the DC bias voltage decreases as the sensed AC voltage increases, or the DC bias voltage increases as the sensed AC voltage decreases. By adjusting the energy supplied to the control terminal 106 in this way, the protection circuit 120 can reduce the likelihood that a voltage difference between the power terminal 104 and control terminal 102 will satisfy the energy threshold, thereby protecting the amplifier 110, for example when the amplifier 110 experiences voltage standing wave ratio (VSWR) variations.

As a second non-limiting example, and with respect to FIG. 1B, the sensing circuit 122 can sense an AC voltage at the control terminal 104 of the transistor 102 of the amplifier 110. The AC voltage at the control terminal 106 can be related to, or influenced by, the AC voltage at the power terminal 104. For example, in some cases, a capacitance is present between the power terminal 104 and the control terminal 106. In this way, the AC voltage at the control terminal 106 can be a function of the AC voltage at the power terminal 104 and the capacitance between the power terminal 104 and the control terminal 106. Continuing with the second non-limiting example, and the supply circuit 124 can supply a DC voltage to the control terminal 106 of the transistor 102 based on the AC voltage sensed by the sensing circuit 122. By adjusting the energy (e.g., DC bias voltage) supplied to the control terminal 106 in this way, the protection circuit 120 can reduce the likelihood that a voltage difference between the power terminal 104 and control terminal 102 will satisfy the energy threshold, thereby protecting the amplifier 110.

FIG. 2 is a block diagram of an example system 200 for reducing the likelihood of breakdown of a transistor 102 of an amplifier 110. The system 200 includes an amplifier 110, a protection circuit 120, and a load circuit 130. Furthermore, similar to the system 150 of FIG. 1B, the sensing circuit 122 of the system 200 is electrically coupled to the control terminal 106 of the transistor 102 of the amplifier 110. It will be appreciated that the protection circuit 120 can be coupled to the amplifier 110 using a different configuration than that illustrated in FIG. 2. For example, in some implementations, the protection circuit 120 is electrically coupled to the power terminal 104 of amplifier 110. Furthermore, it will be appreciated that the system 200 can include fewer or more components as desired. For example, in some implementations, the system 200 does not include the amplifier 110 and/or the load circuit 130.

As illustrated, in some cases, the amplifier 110 includes a first transistor 102 connected in series with a second transistor 202, which is sometimes referred to herein as a "stacked" arrangement. The power terminal 108 of the first transistor 102 can be electrically connected to the power terminal 204 of the transistor 202. In this way, the amplifier 110 can achieve a higher output power, as compared to an amplifier having only a single transistor. The amplifier 110 can include the capacitor 112. For example, as shown, the capacitor 112 can be electrically coupled between the control terminal 106 and ground, thereby functioning as a voltage divider. Although the amplifier 110 of FIG. 2 is illustrated as including two transistors 102 and 202, in some cases, the amplifier 110 includes fewer or more transistors, and the transistor can be stacked or un-stacked. Although the transistors 102 and 202 are illustrated as PMOS transistors, it will be understood that the transistors 102 and 202 can be any type of transistor. For example, in some implementations, one or both of the transistors 102 and 202 are a FET, a BJT, a CMOS transistor, NMOS transistor, or the like.

Similar to the systems 100 and 150 of FIGS. 1A and 1B, respectively, the protection circuit 120 can include a sensing circuit 122. As illustrated in FIG. 2, the sensing circuit 122 can be electrically coupled to the supply circuit 120 and the control terminal 104 of the first transistor 102. As mentioned, in some cases, the sensing circuit 122 is electrically coupled to the power terminal 104 of the first transistor 102.

Figure 5:
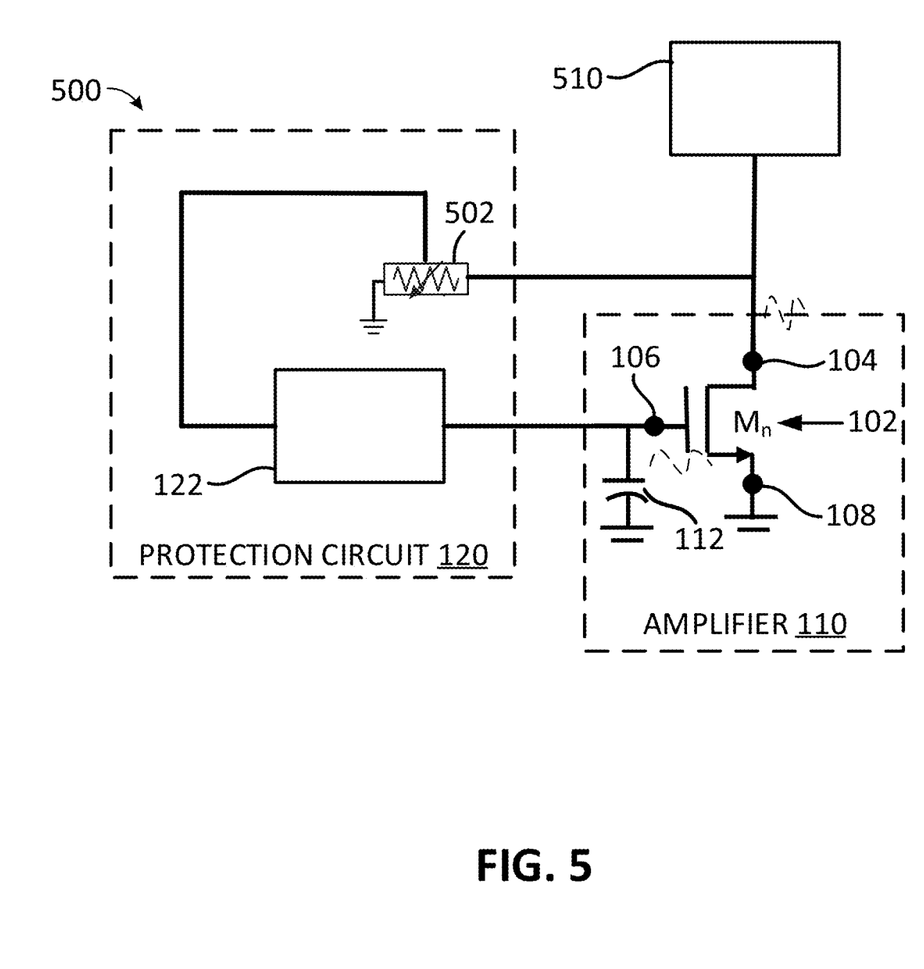
FIG. 5 illustrates a block diagram of an example system for reducing the likelihood of breakdown of a transistor of an amplifier.

The load circuit 130 can include an input/output matching circuit 236 and an antenna circuit 238. The input/output matching circuit 236 can be configured to modify the power transfer or signal reflection from a load. For example, the input/output matching circuit 236 can include an impedance that corresponds to an electrical load or a signal source, so as to produce a threshold power transfer (e.g., a maximum power transfer) or a threshold signal reflection (e.g., a minimum signal reflection) from the load. In some cases, the antenna circuit 238 can be implemented as a controllable impedance, for example as illustrated in FIG. 5. For example, the antenna circuit 238 can be configured to loan the system 200.

The sensing circuit 122 can include a component 232 that is electrically coupled to the first transistor 102. The component 232 can be configured to sense energy. For example, the component 232 can be configured to monitor, receive, or output AC voltage, AC current, DC voltage, or DC current. In some cases, the component 232 can output a value (e.g., a DC value) corresponding to a peak value of a sensed AC signal. For example, in some cases, the component 232 can include a peak detector that is configured to output a DC voltage equal to the peak value of the sensed AC signal. In some cases, the component 232 can output a value equal to a peak-to-peak value of a sensed AC signal. For example, the component 232 can include an envelope detector that provides an output which corresponds to an envelope of the sensed AC signal. Furthermore, in some cases, the sensing circuit 122 can include an amplifier 234, for example to amplify an output of the component 232. It will be appreciated that the sensing circuit 122 can include fewer or more components, as desired. For example, in some implementations, the sensing circuit 122 does not include the amplifier 234. In some cases, the amplifier 234 is an operational amplifier. As another example, in some cases, the sensing circuit 122 can include a component for a tapping impedance, such as one or more resistive, capacitive, inductive, impedance, active, or passive elements. For example, the sensing circuit 122 can include one or more capacitors, resistor, inductors, diodes, transistors (for example, a MOSFET, a CMOS transistor, an NMOS transistor, a PMOS transistor, a BJT, etc.) transmission lines, couplers, or amplifiers (for example, an operational amplifier), or the like.

The protection circuit 120 can include a supply circuit 124, as described herein. The supply circuit 124 can be in electrical communication with the sensing circuit 122. Furthermore, the supply circuit 124 can be in electrical communication with transistor 102 and/or the transistor 202. For example, as illustrated, the supply circuit 124 can be in electrical communication with the control terminal 106 of the transistor 102 and/or the control terminal 206 of the transistor 202.

The supply circuit 124 can be configured to supply energy to the transistor 102 and/or the transistor 202. In some cases, the supply circuit 124 supplies the same amount of energy to each of the first transistor 102 and the second transistor 202. In some cases, the supply circuit 124 supplies a different amount of energy to each of the first transistor 102 and the second transistor 202.

In some cases, the energy supplied by the supply circuit 124 includes alternating AC energy, such as an AC current or an AC voltage. In some cases, the energy supplied by the supply circuit 124 includes DC energy, such as a DC current or a DC voltage. In some cases, the amount of energy supplied by the supply circuit 124 can be based at least in part on energy sensed by the sensing circuit 122. For example, in some cases, the energy supplied by the supply circuit 124 varies based on the energy sensed by the sensing circuit 122. For instance, in some cases, the energy supplied by the supply circuit 124 can increase as the energy sensed by the sensing circuit 122 increases. As a corollary, in some cases, the energy supplied by the supply circuit 124 can decrease as the energy sensed by the sensing circuit 122 decreases.

As illustrated, the supply circuit 124 can be electrically coupled to the sensing circuit 122, and can receive a signal from the sensing circuit 122, which can be in the form of a voltage or current. In some cases, the supply circuit 124 supplies energy to the transistor 102 or the transistor 202 based on the signal from the sensing circuit 122. For example, the variable voltage sources 242, 244 can be controlled based at least in part on the output of the sensing circuit 122.

As a non-limiting example, and with respect to FIG. 2, the component 232 of the sensing circuit 122 can sense an AC voltage at the control terminal 106 of the transistor 102 of the amplifier 110. As described herein, in some cases, the AC voltage at the control terminal 106 can be related to, or influenced by, the AC or DC voltage at the power terminal 104. Thus, in some such cases, an increase in voltage (for example, due to a voltage swing) at the power terminal 104 can be detected by sensing voltage at the control terminal 106. Returning to the example, the component 232 of the sensing circuit 122 can output a signal corresponding to the sensed AC voltage, and the amplifier 234 of the sensing circuit 122 can amplify the signal. The supply circuit 124 receives the amplified signal from the sensing circuit 122 and generates a pair of DC bias voltages based on the amplified signal. The supply circuit 124 supplies a first DC bias voltage to the control terminal 106 of the first transistor 102 and supplies a second DC bias voltage to the control terminal 206 of the second transistor 202. As described herein, by supplying the first DC bias voltage to the control terminal 106, the protection circuit 120 can advantageously reduce a voltage difference between the power terminal 104 and the control terminal 106, which can protect the transistor 102 from breakdown. Similarly, by supplying the second DC bias voltage to the control terminal 206, the protection circuit 120 can advantageously reduce a voltage difference between the power terminal 204 and the control terminal 206, which can protect the transistor 202 from breakdown. As described herein, in some cases, the first DC bias voltage can be the same as the second DC bias voltage. Alternatively, in some cases, the first DC bias voltage can be different from the second DC bias voltage.

FIG. 3 is a block diagram of an example system 300 for reducing the likelihood of breakdown of a transistor 102 of an amplifier 110. As illustrated, the system 300 can include an amplifier 110, a protection circuit 120, and a load circuit 130. The system 300 can be an embodiment of, and can include any one or any combination of the components described with respect to, any of the systems described herein, such as systems 100 or 200 of FIG. 1A, 1B, or 2.

As described herein, the energy supplied by the supply circuit 124 to the transistor 102 can vary based on an energy sensed at the transistor 102. For example, as the voltage increases at the power terminal 104 or the control terminal 106 of the transistor 102, the energy supplied by the protection circuit 120 can increase. In this way, the protection circuit 120 can reduce the likelihood of breakdown of the transistor 102 caused by energy that satisfies an energy threshold.

In the illustrated embodiment of FIG. 3, the supply circuit 124 includes a transistor 316, current sources 302 and 304, an amplifier 306, and resistive elements 308 and 310. Furthermore, the supply circuit 124 includes a replica circuit 350 configured to aid the supply circuit 124 in accounting for process, supply voltage, and temperature (PVT) variabilities experienced by the transistors 102 and 202. As described herein, the transistor 102 may be susceptible to damage when exposed to energy that satisfies a first energy threshold and the transistor 202 may be susceptible to damage when exposed to energy that satisfies a second energy threshold. In some cases, the first and second energy thresholds can vary, for example, based on PVT variabilities. For instance, in some cases, a smaller feature size can cause the transistor 102 or 202 to be more vulnerable to PVT variability. In some cases, to address the PVT variability issues, at least a portion of the protection circuit 120 can mirror, or replicate, at least a portion of the amplifier. In this example, the supply circuit 124 includes a replica circuit 350 that includes a first transistor 312 and a second transistor 314, which mirror the first transistor 102 and second transistor 202 of the amplifier 110. The first transistor 312 and second transistor 314 can be of a similar size, and/or have similar PVT variations, to the first transistor 102 and the second transistor 202, respectively. Furthermore, the transistors 312 and 314 can be in the same configuration as transistors 102 and 202. For example, as illustrated, the transistors 312 and 314 can be in a stacked arrangement, similar to the arrangement of the transistors 102 and 104.

In some cases, the transistors 312, 314 of the replica circuit 350 experiences the same or similar PVT variations experienced by transistors 102 and 202. Thus, by integrating the replica circuit 350 into the supply circuit, the supply circuit 124 (and/or the DC bias voltages) can compensate for at least some of the PVT variability experienced at the amplifier 110. For example, the energy supplied by the supply circuit 124 to the amplifier 110 can be based on the PVT variations experienced by the transistors 312, 314, which can be similar to the PVT variations experienced by the transistors 102, 202. Accordingly, in some cases, the protection circuit 120 can protect the amplifier 110, or components thereof, even if PVT variations are present.

The supply circuit 124 can receive a voltage output from the sensing circuit 122 and can convert the voltage output into a current signal. As described herein, the voltage output from the sensing circuit 122 can correspond to a voltage sensed at one or more of the terminals of the transistor 102. The voltage output from the sensing circuit 122 can correspond to an AC voltage sensed at the control terminal of the transistor 102. The control terminal of the transistor 316 can receive the voltage output from the sensing circuit 122 and can convert the voltage into a current, I1, through the transistor 316. As a result, in some cases, the current, I1, can vary based on the voltage sensed by the sensing circuit 122. For example, the current, I1, can be determined using the following equation:

$$I1 = fn(Vgn) \quad \text{(Equation 1)}$$

where I1 is the current flowing through the transistor 316 and Vgn is the AC voltage sensed by the sensing circuit 122 at the control terminal of the transistor 102.

Furthermore, based on the configuration of the current source 304 and the resistor 308, the voltage (Vref) input into the amplifier 306 can be a function of the current, Ix, the current of the current source 304, and the resistance of the resistor 308. For example, in some cases, Vref can be determined using the following equation:

$$Vref = (Ix + Iref) * R \quad \text{(Equation 2)}$$

where Vref is the voltage input into the amplifier I1, Ix is the current flowing through the transistor 316, Iref is the current of the current source 304, and R is the resistance of the resistor 308. Furthermore, in this example, the output of the amplifier (Vbias) is equal to Vref. This is based at least in part on the configuration of the replica circuit 350, as the configuration of the amplifier 306 receiving as its inputs the voltage, Vref, and the voltage at the power terminal of the transistor 312.

As demonstrated by the relationships above, the protection circuit 120 (e.g., the supply circuit 124 and the sensing circuit 122) can advantageously protect the transistor 102 from breakdown. For example, by properly scaling or choosing a size of the transistor 316 of the supply circuit 124 and the impedance of the sensing circuit 302, the protection circuit 120 can be configured to protect the amplifier 110. For example, by sensing the AC voltage at the transistor 102 (e.g., at the control terminal 106, at the power terminal 104, etc.) and modifying the voltage supplied to the control terminal 106 of the transistor 102, the protection circuit 120 can ensure that the voltage difference between the power terminal 104 and the control terminal 106 of the transistor 102 of the amplifier 110 does not satisfy an energy threshold (e.g., corresponding to a breakdown operating condition). Accordingly, when a voltage swing at the transistor 102 increases, the protection circuit 120 can be configured to increase a voltage supplied to the control terminal 106, thereby reducing the voltage difference between the terminals of the transistor 102 and protecting the transistor 102.

For example, a change in AC or DC voltage (e.g., due to VSWR variations) at the power terminal 104 of the transistor 102 can induce a change in the AC voltage at the power terminal 104 and/or the control terminal 106 of the transistor 102. For instance, as VSWR increases, the AC voltage at the power terminal 104 can also increase. The increase in the AC voltage at the power terminal 104 can induce an increase in the AC voltage at the control terminal 106. Thus, in some cases, the sensing circuit 122 can be configured to sense AC voltage from either the power terminal 104 or the control terminal 106, as the AC voltage at either the power terminal 104 or the control terminal 106 can be a function of the voltage at the power terminal 104 of the transistor 102.

The sensing circuit 122 can sense an AC voltage at the transistor 102 and can provide a signal to the supply circuit 124, which can use the signal to generate a DC bias voltage to supply to the control terminal 106 of the transistor 102. As described herein, the DC bias voltage supplied by the supply circuit 124 to the transistor 102 can be based on the voltage sensed by the sensing circuit 122. For example, as the voltage sensed by the sensing circuit 122 increases, the current, I1, though the transistor 316 increases, which increases the voltage, Vref, and the voltage, Vbias. Accordingly, the protection circuit 120 can advantageously provide a means of protection for the transistor 102, for example in that the protection circuit 120 can limit or reduce the likelihood that a voltage difference between the power terminal 104 and the control terminal 106 satisfies an energy threshold.

In some cases, the size and/or impedance of the components of the sensing circuit 122 and/or the size or characteristics of the transistor 316 can be adjusted to modify the energy supplied to the transistor 102 by the supply circuit 123.

FIG. 4 is a block diagram of an example system 400 for reducing the likelihood of breakdown of the transistors 102, 202 of an amplifier 110. As illustrated, the system 400 can include an amplifier 110, a protection circuit 120, and a load circuit 130. The system 400 can be an embodiment of, and can include any one or any combination of the components described with respect to, any of the systems described herein, such as systems 100, 200, or 300 of FIG. 1A, 1B, 2, or 3.

The protection circuit 120 of system 400 can advantageously provide protection to both the top device (i.e., transistor 102) and the bottom device (i.e., transistor 202). For example, similar to the system 300 of FIG. 3, the protection circuit 120 can be configured to supply a first DC voltage (Vbias1) to the control terminal 106 of the first transistor 102. Furthermore, the protection circuit 120 can be configured to supply a second DC voltage (Vbias2) to the second transistor 202. In this way, the protection 120 can reduce the likelihood of breakdown of either the first transistor 102 or the second transistor 202 by supplying the first transistor 102 and the second transistor 202 with voltages. Although FIG. 4 illustrates the protection circuit 120 as supplying the second DC voltage to the control terminal 206 of the second transistor 202, it will be understood that, in some cases, the protection circuit 120 can be configured to supply the second DC voltage to the first power terminal 204 or the second power terminal 208 of the transistor 202 in addition to or instead of the control terminal 206.

As described herein, the first DC voltage (e.g., the voltage at the node at Vbias1) can be modified based on the voltage sensed by the sensing circuit 122. Similarly, the second DC voltage (e.g., the voltage at the node at Vbias2) can be modified based on the voltage sensed by the sensing circuit 122. In some cases, the first DC voltage and the second DC voltage are the same or are substantially similar. In some cases, the first DC voltage and the second DC voltage are different. For example, in some cases, the first transistor 102 and the second transistor 202 have different energy thresholds at which the transistors are likely to breakdown. Thus, the first DC voltage can be modified to protect the first transistor 102, and the second DC voltage can be modified to protect the second transistor 202. In some cases, supplying the first DC voltage to the first transistor 102 and/or supplying the second DC voltage to the second transistor 202 does not affect, or does not substantially affect, the current of the amplifier 110 and/or the output power of the amplifier 110.

As shown, similar to the system 300 of FIG. 3, the protection circuit 120 includes a sensing circuit 122, transistors 312, 314, and 316, current sources 302 and 304, an amplifier 306, and resistive elements 308 and 310. Furthermore, in this example, the protection circuit 120 includes a transistor 418 and a resistor 248. The transistor 418 can be electrically coupled to the output of the sensing circuit 122. For example, the control terminal of the transistor 408 can receive the voltage output of the sensing circuit and can convert the voltage into a current, I2, through the transistor 418. As a result, in this example, the current, I2, varies based on the voltage sensed by the sensing circuit 122. For example, the current, I2, can be determined using the following equation:

$$I2 = fn(Vdn) \quad \text{(Equation 3)}$$

where I2 is the current flowing through the transistor 418 and Vdn is the AC voltage sensed by the sensing circuit 122 at the power terminal 104 of the transistor 102. By including the transistor 418 in the protection circuit 120 as illustrated, the current, I3, flowing through transistor 314 can be determined using the following equation:

$$I3 = Ibias + I2 \quad \text{(Equation 4)}$$

where I3 is the current flowing through the transistor 314, Ibias is the current from the current source 302, and I2 is the current flowing through transistor 418.

As demonstrated by the relationships above, the protection circuit 120 can advantageously protect the second transistor 202 from breakdown. For example, by properly scaling or choosing a size of the transistor 418 and/or the impedance of the sensing circuit 122, the protection circuit 120 can be configured to protect the second transistor 202 of the amplifier 110. For example, by sensing the AC voltage at the transistor 102 (e.g., at the control terminal 106, at the power terminal 104, etc.) and modifying the second DC voltage supplied to the control terminal 206 of the transistor 202, the protection circuit 120 can ensure that the voltage difference between the power terminal 204 and the control terminal 206 of the transistor 202 of the amplifier 110 does not satisfy a second energy threshold (e.g., corresponding to a breakdown operating condition of the second transistor 202). Accordingly, when a voltage swing at the transistor 102 increases, the protection circuit 120 can be configured to increase the second DC voltage supplied to the control terminal 206, thereby reducing the voltage difference between the terminals of the transistor 202 and protecting the transistor 202.

For example, a change in AC or DC voltage (e.g., due to VSWR variations) at the power terminal 104 of the transistor 102 can induce a change in the AC voltage sensed by the sensing circuit 122. The sensing circuit 122 can sense an AC voltage at the transistor 102 and can provide a voltage output to the transistor 418, which can generate a second DC bias voltage to supply to the control terminal 106 of the transistor 102. As described herein, the second DC voltage supplied by the supply circuit 124 to the transistor 102 can be based on the voltage sensed by the sensing circuit 122. For example, as the voltage sensed by the sensing circuit 122 increases, the current, I1, though the transistor 316 increases, which increases the voltage, Vref, and the second DC voltage. Accordingly, the protection circuit 120 can advantageously provide a means of protection for the transistor 202, for example in that the protection circuit 120 can limit or reduce the likelihood that a voltage difference between the power terminal 104 and the control terminal 106 satisfies an energy threshold.

In some cases, the size and/or impedance of the components of the sensing circuit 122 and/or the size or characteristics of the transistor 316 can be adjusted to modify the energy supplied to the transistor 102 by the supply circuit 123.

Although FIG. 4 illustrates the amplifier 110 as including only two transistors (e.g., transistors 102 and 202), it will be understood that the amplifier 110 can include more than two transistors, such as three, four, or five transistors. Furthermore, it will be understood that similar techniques to those described herein can be utilized to protect any of the transistors from breakdown.

FIG. 5 illustrates a block diagram of an example system for reducing the likelihood of breakdown of a transistor 102 of an amplifier 110. In the illustrated example, the system 500 includes an amplifier 110, a protection circuit 120, and an input/output matching circuit 510. It will be appreciated that the system 500 can include fewer or more components as desired. For example, in some implementations, the system 500 may not include the amplifier 110 and/or the input/output matching circuit 510.

The input/output matching circuit 510 can be configured to modify the power transfer or signal reflection from a load. For example, the input/output matching circuit 510 can include an impedance that corresponds to an electrical load or a signal source, so as to produce a threshold power transfer (e.g., a maximum power transfer) or a threshold signal reflection (e.g., a minimum signal reflection) from the load. In some cases, the input/output matching circuit 510 can be an embodiment of the load circuit 130 described herein.

The protection circuit 120 can reduce the likelihood of breakdown of the amplifier 110. Similar to as described with respect to FIGS. 1A-4, the protection circuit 120 of FIG. 5 can include a sensing circuit 122, which can be configured to sense energy corresponding to the transistor 102. Although FIG. 5 illustrates the sensing circuit 122 as being electrically coupled to, and sensing energy from, the control terminal 106 of the transistor 102, this configuration should not be construed as limiting. For example, the sensing circuit 122 can be electrically coupled to, and can sense energy from, any of the terminals of the transistor (e.g., power terminal 104) and/or any one or more terminals of another transistor, such as transistor 202 of any of FIG. 2, 3, or 4.

Furthermore, as illustrated in FIG. 5, the protection circuit 120 can include a controllable impedance 502. The controller impedance 502 can include, but is not limited to, one or more of a transistor, diode, capacitor, or resistor. In some cases, the controllable impedance 502 can emulate an arbitrary impedance and is used to tune the energy received and/or present at the transistor 102, such as at the power terminal 104 or the control terminal 106 of the transistor 102. In some cases, the impedance of the controllable impedance 502 can be controlled based on an output of the sensing circuit 122. For example, the impedance of the controllable impedance 502 can be scaled up and down based on the output of the sensing circuit 122. For example, in some cases, the impedance of the controllable impedance 502 can be scaled between infinite (e.g., open-circuit) impedance and zero impedance based on energy present at the transistor 102.

As described herein, the output of the sensing circuit 122 can be based on the energy present at the transistor 102. Similarly, the impedance of the controllable impedance 502 can be modified based on the energy present at the transistor 102. For example, if the energy present at the transistor 102 satisfies an energy threshold, the impedance of the controllable impedance 502 can reduced, for example to load the system 500 and dissipate at least some energy present at the transistor 102. As another example, if the energy present at the transistor 102 does not satisfy an energy threshold, the impedance of the controllable impedance 502 can increased, for example such that the controllable impedance 502 operates as a high- or infinite-impedance load (e.g., an open circuit). In some cases, under normal operating conditions (e.g., the energy at the transistor 102 does not satisfy the energy threshold), the controllable impedance 502 can operate as a high impedance load. However, as a change (e.g., an increase) in AC or DC voltage (e.g., due to VSWR variations) at the power terminal 104 or the control terminal 106 of the transistor 102 can induce a change in the impedance of the controllable impedance 502.

As a non-limiting example, and with respect to FIG. 5, the sensing circuit 122 senses an AC voltage at the control terminal 106 of the transistor 102 of the amplifier 110. The output of the sensing circuit 122 is received as an input to the controllable impedance 502, and the impedance of the controllable impedance 502 is adjusted based on the voltage output. As described herein, the output of the sensing circuit 122 can vary based on the sensed AC voltage. In this way, the impedance of the controllable impedance 502 can be controlled based on the energy (e.g., AC voltage) present at the transistor 102. By adjusting the impedance of the controllable impedance 502, the system 500 can dissipate energy from the transistor 102 when the energy at the transistor 102 satisfies an energy threshold. In this way, the protection circuit 120 can reduce the likelihood that the transistor 102 will breakdown, for example when the amplifier 110 experiences voltage standing wave ratio (VSWR) variations.

Terminology

Unless the context indicates otherwise, throughout the description and the claims, the words "comprise," "comprising," "include," "including," and the like are to generally be construed in an inclusive sense, as opposed to an exclusive or exhaustive sense; that is to say, in the sense of "including, but not limited to." The word "coupled," as generally used herein, refers to two or more elements that may be either directly coupled to each other, or coupled by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural may also include the plural or singular, respectively. The word "or" in reference to a list of two or more items, is generally intended to encompass all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding whether these features, elements and/or states are included or are to be performed in any particular embodiment.

While certain embodiments have been described, these embodiments have been presented by way of example only, and are not intended to limit the scope of the disclosure. Indeed, the novel methods, apparatus, systems, devices, and integrate circuits described herein may be embodied in a variety of other forms; furthermore, various omissions, substitutions and changes in the form of the methods, apparatus, and systems described herein may be made without departing from the spirit of the disclosure.

The claims presented herein are in single dependency format suitable for filing at the United States Patent & Trademark Office. However, it is to be assumed that each one of the claims can be multiply dependent on any preceding claim except where that is technically unfeasible.

What is claimed is:
1. A system comprising:
an amplifier comprising a first transistor and a second transistor;

a sensing circuit electrically coupled to the amplifier and configured to sense an alternating current (AC) signal at the first transistor of the amplifier, wherein the sensing circuit comprises a component that generates a first direct current (DC) signal based at least in part on the AC signal; and a protection circuit electrically coupled to the sensing circuit and the amplifier, the protection circuit configured to:

supply a second DC signal to a control terminal of the first transistor of the amplifier, wherein the second DC signal is based at least in part on the first DC signal and a constant DC signal, and supply a second DC signal to a control terminal of the second transistor of the amplifier, wherein the second DC signal varies based at least in part on the AC signal sensed by the sensing circuit.

2. The system of claim 1, wherein the sensing circuit senses the AC signal at the control terminal of the first transistor of the amplifier.

3. The system of claim 1, wherein each of the first transistor and the second transistor comprises source, gate, and drain terminals, wherein the control terminal of the first transistor is the gate terminal of the first transistor, wherein the control terminal of the second transistor is the gate terminal of the second transistor, and wherein the source terminal of the first transistor is electrically coupled to the drain terminal of the second transistor.

4. The system of claim 1, wherein at least one of the first transistor or the second transistor is a field-effect transistor or a bipolar transistor.

5. The system of claim 1, wherein the first DC signal is different from the second DC signal.

6. The system of claim 1, wherein the protection circuit comprises:

a third transistor in electrical communication with the sensing circuit, wherein the first DC signal is based at least in part on a current flowing through the third transistor; and a fourth transistor in electrical communication with the sensing circuit, wherein the second DC signal corresponds to a signal at a power terminal of the fourth transistor.

7. The system of claim 1, wherein the component comprises at least one of a peak detector or an envelope detector.

8. The system of claim 1, wherein the protection circuit comprises a third transistor in electrical communication with the sensing circuit, wherein the first DC signal is based at least in part on a current flowing through the third transistor.

9. An apparatus for reducing a likelihood of breakdown of a transistor of an amplifier, the system comprising:

a protection circuit electrically coupled to the amplifier, the protection circuit configured to:

sense an alternating current (AC) signal at a first transistor of the amplifier;

generate a first direct current (DC) signal based at least in part on the AC signal;

generate a second DC signal based at least in part on the AC signal;

supply the first DC signal to a control terminal of a first transistor of the amplifier, wherein the first DC signal varies based at least in part on an AC signal, and supply a second DC signal to a second transistor of the amplifier, wherein the second DC signal varies based at least in part on the AC signal at the first transistor.

10. The apparatus of claim 9, wherein the AC signal at the first transistor corresponds to an AC signal at a control terminal of the first transistor.

11. The apparatus of claim 9, wherein the second DC signal is supplied to a control terminal of the second transistor of the amplifier.

12. The apparatus of claim 9, wherein the second DC signal is supplied to a power terminal of the second transistor of the amplifier.

13. The apparatus of claim 9, wherein the first transistor and the second transistor are a complementary metal-oxide-semiconductor (CMOS) transistors and each of the first transistor and the second transistor comprises source, gate, and drain terminals, wherein the control terminal of the first transistor is the gate terminal of the first transistor, wherein the source terminal of the first transistor is electrically coupled to the drain terminal of the second transistor.

14. The apparatus of claim 13, wherein the second DC signal is supplied to the gate terminal of the second transistor of the amplifier.

15. The apparatus of claim 9, wherein the protection circuit comprises at least one of a peak detector or an envelope detector for sensing the AC signal and generating the first DC signal and the second DC signal.

16. The apparatus of claim 9, wherein the protection circuit comprises a third transistor, wherein the first DC signal is based at least in part on a current flowing through the third transistor.

17. A system comprising:

an amplifier comprising a transistor;

a sensing circuit configured to:

sense an alternating current (AC) signal at the transistor, and generate a first direct current (DC) signal based at least in part on the AC signal; and a protection circuit electrically coupled to the sensing circuit and the amplifier, the protection circuit configured to:

supply a second DC signal to a control terminal of the transistor, wherein the second DC signal is based at least in part on the first DC signal and a fixed DC signal, and wherein the second DC signal varies based at least in part on the AC signal.

18. The system of claim 17, wherein the transistor is a first transistor, wherein the protection circuit comprises a second transistor in electrical communication with the sensing circuit, wherein the first DC signal is based at least in part on a current flowing through the second transistor.

19. The system of claim 17, wherein sensing circuit comprises at least one of a peak detector or an envelope detector, wherein the sensing circuit senses the AC signal and generates the first DC signal using the at least one of the peak detector or the envelope detector.

* * * * *